(12) United States Patent
Becker

(10) Patent No.: US 7,135,908 B2
(45) Date of Patent: Nov. 14, 2006

(54) INPUT STAGE RESISTANT AGAINST HIGH VOLTAGE SWINGS

(75) Inventor: Rolf Friedrich Philipp Becker, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 100 days.

(21) Appl. No.: 10/503,428

(22) PCT Filed: Jan. 29, 2003

(86) PCT No.: PCT/IB03/00298

§ 371 (c)(1),
(2), (4) Date: Aug. 3, 2004

(87) PCT Pub. No.: WO03/067761

PCT Pub. Date: Aug. 14, 2003

(65) Prior Publication Data

US 2005/0088208 A1   Apr. 28, 2005

(30) Foreign Application Priority Data

Feb. 6, 2002   (EP) .................................. 02002681

(51) Int. Cl.
*H03K 5/08* (2006.01)
(52) U.S. Cl. .................. 327/312; 327/313; 327/318
(58) Field of Classification Search ................ 327/312, 327/313
See application file for complete search history.

(56) References Cited

U.S. PATENT DOCUMENTS 4,858,055 A * 8/1989 Okitaka ....................... 361/56
5,574,395 A * 11/1996 Kusakabe ..................... 327/309
6,181,193 B1 * 1/2001 Coughlin, Jr. ................ 327/325
6,291,288 B1 * 9/2001 Huang et al. ................. 438/239

OTHER PUBLICATIONS

NN880596, "Overvoltage Protection Circuit", IBM Technical Disclosure Bulletin, IBM Corp., US, vol. 30, No. 12, May 1988, p. 96-97.*
"Overvoltage Protection Circuit", IBM Technical Disclosure Bulletin, vol. 30, No. 12, May 1, 1988, pp. 96-97.

* cited by examiner

*Primary Examiner*—Long Nguyen
(74) *Attorney, Agent, or Firm*—Kevin Fortin

(57) ABSTRACT

An input stage includes a signal input (IN) for receiving an input signal s(t) and a digital input stage (15) designed for operation at a supply voltage (VDD). The input stage (15) includes CMOS transistors, which are sensitive to voltages across transistor nodes going beyond a voltage limit ($V_{max}$) and an input (IINV). Voltage limiting circuitry (B) is arranged between the signal input (IN) and the input (IINV). The voltage limiting circuitry (B) includes an input switch (ns) controllable by the state of the input signal s(t), and limit voltages at the input (IINV) to the supply voltage (VDD). In addition, over-voltage protection (A) is provided between the signal input (IN) and the supply voltage (VDD). The circuitry for over-voltage protection (A) includes at least one active circuit element arranged so as to mimic part of a zener function.

13 Claims, 5 Drawing Sheets

INPUT STAGE RESISTANT AGAINST HIGH VOLTAGE SWINGS

The present invention relates to input stages having an improved protection against voltage swings. In particular, the present invention relates to digital input stages and their protection.

While modern CMOS IC (complementary metal oxide semiconductor integrated circuit) fabrication technologies are going down with critical geometrical dimensions, the maximum allowed voltage swing across individual transistors and with it the maximum allowed supply voltage is going down rapidly. On the other hand the signal swing at an input port of a CMOS device must for compatibility reasons go beyond these voltage limits.

A solution to this problem presently is to enhance the CMOS fabrication process by processing steps, which allow the fabrication of transistors capable of working at higher voltage swings. This on one hand requires additional and costly fabrication steps and on the other hand calls for an additional supply domain and level shifters to accommodate to the voltage swing internal to the integrated circuit.

In particular in modern submicron CMOS processes the maximum supply voltage $V_{DDmax}$ is determined by reliability considerations for application of transistors in standard digital gates. The requirement is that any voltage difference across transistor nodes does not go beyond certain limit $V_{max}$. FIG. 1 shows the relevant voltages of an n-channel transistor 1 with $V_{GS}$, $V_{DS}$, $V_{GD} < V_{max}$, for example. For digital gates this requires $V_{max}$ to be the maximum allowed supply voltage of the whole chip of which the transistor is a part. Note that the voltage towards bulk is not limited to the same extent.

For signal processing this requires the signal swing to stay within the limits posed by the maximum allowed supply voltage. With supply voltages going down further with the advance of smaller geometry this has a severe impact on the accommodation of signal swings at the input ports of a circuit, which in many cases go beyond $V_{max}$.

A state of the art input stage circuit 2 is illustrated in FIG. 2. The standard digital input stage 2 comprises two inverters 11 and 12 being supplied by the chip supply voltage $V_{DD}$. Electrostatic discharge (ESD) protection elements R1, D1 and D2 are provided between the circuit's input pad 3 and the input IINV of the input stage 2. ESD protection is employed in order to prevent the very sensitive input stage 2 from being destroyed when it is subjected to a discharge event. This might happen for example when somebody induces a voltage peak into the circuitry by touching the pins of the chip. In general $V_{DD}$ would be close to $V_{max}$. In case a high voltage input signal going beyond the limits of $V_{max}$ dictated by the fabrication technology is applied, the voltage at the node IINV would go above the limit, leading to destruction or at least severe life time reduction. Another effect is that the diode D2 would go into conduction. This would lead to an undesirable static current flow. The input stage 2 of FIG. 2 comprises standard transistors ni1, ni2, pi1, and pi2.

As mentioned above, one possible solution to the problem is to add fabrication steps to produce circuit elements which are able to withstand higher voltages. FIG. 3 shows a corresponding example. An input stage 4 with ESD protection elements R1, D1 and D2 is shown. In this case transistors ni1, ni2, pi1, and pi2 of the input stage 4 are special elements being designed to cope with voltages higher than $V_{max}$ by special and expensive process steps. Note that an additional supply domain $V_{DDhigh}$ and a level shifter 5 is required in order to shift the voltages to the lower levels of the $V_{DD}$ voltage domain.

It is an object of the present invention to provide circuits that avoids or reduces the drawbacks of conventional devices, and to provide devices based on such circuits.

It is another object of the present invention to provide devices with an improved resistance against voltage swings at their input.

These and other objects are accomplished by a circuit that comprises a signal input for receiving an input signal, and a digital input stage being designed for operation at a supply voltage. The input stage comprises an input (IINV) and CMOS transistors that are known to be sensitive to voltages across transistor nodes going beyond a voltage limit. Voltage limiting means are arranged between the signal input and the input (IINV). The voltage limiting means comprise an input switch being controllable by the state of the input signal and are employed in order to limit voltages at the input (IINV) to the supply voltage. The circuit further comprises means for over-voltage protection being situated between the signal input and the supply voltage. The means for over-voltage protection comprise at least one active circuit element that is arranged so as to mimic at least the breakdown part of a zener function.

The present invention allows to realize circuits with reduced fabrication technology costs and less complex system design.

For a more complete description of the present invention and for further objects and advantages thereof, reference is made to the following description, taken in conjunction with the accompanying drawings, in which.

Figure 4:
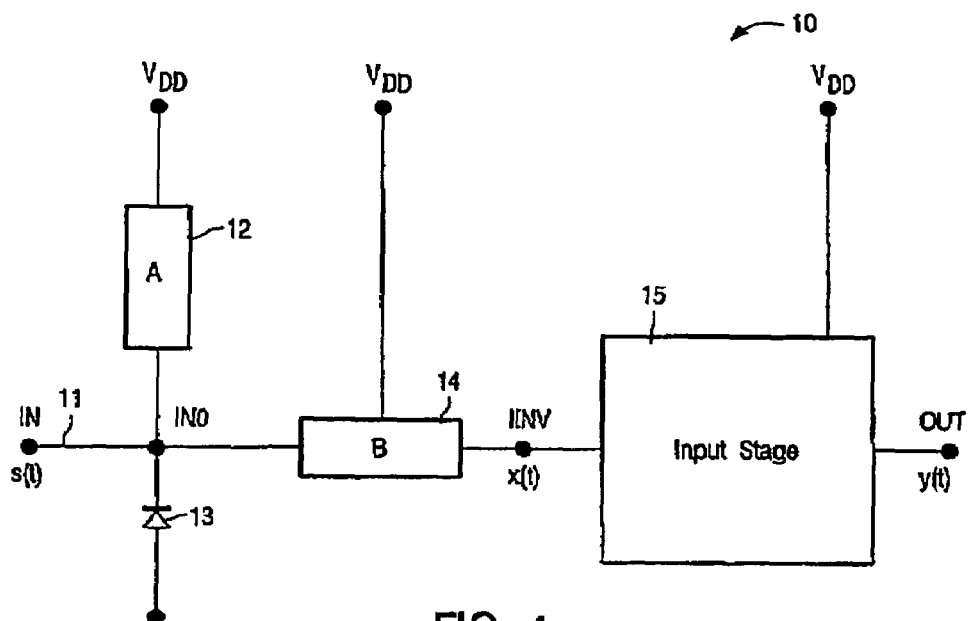
FIG. 4 is a schematic representation of a first embodiment according to the present invention.

A first embodiment is illustrated in FIG. 4. A circuit 10 is shown that comprises a signal input 11 (IN) for receiving a digital input signal s(t), and a digital input stage 15 being designed for operation at a supply voltage $V_{DD}$. The input stage 15 comprises several CMOS transistors and an input IINV. These transistors are sensitive to voltages across their nodes going beyond a voltage limit $V_{max}$. In order to protect the digital input stage 15 against high voltage swings at the signal input 11 (IN), voltage limiting means 14 (B) are arranged between the signal input 11 (IN) and the input IINV. The voltage limiting means 14 (B) limit the voltages at the input IINV to the supply voltage $V_{DD}$. In order to be able to achieve this, the voltage limiting means 14 (B) comprise an input switch (ns) being controllable by the state of the input signal s(t). In addition to the voltage limiting means 14 (B), the circuit 10 comprises means for over-voltage protection 12 (A) being situated between the signal input 11 (IN) and the supply voltage ($V_{DD}$). The means for over-voltage protection 12 (A) comprise at least one active circuit element being arranged so as to mimic at least the breakdown part of a zener function. I.e., the means for over-voltage protection 12 (A) at least partially operate like a zener diode.

The circuit 10 may also comprise an input protection diode 13 (D1) being situated between the input node (IN0) and ground, as depicted in FIG. 4.

Figure 5:
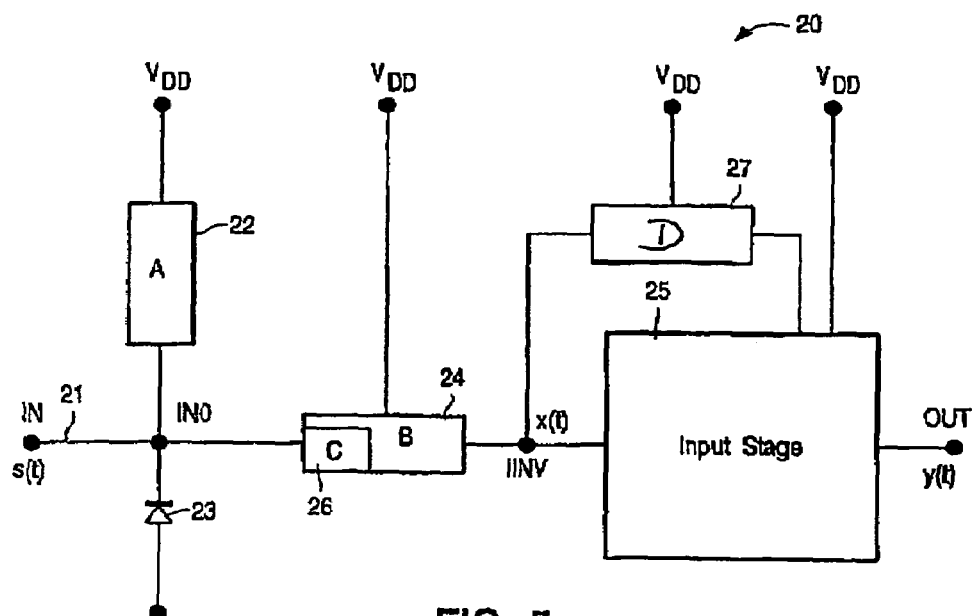
FIG. 5 is a schematic representation of a second embodiment according to the present invention.

Another embodiment is illustrated in FIG. 5. The circuit 20 in FIG. 5 comprises a digital input stage 25 having an input IINV and an output OUT. Like in FIG. 4, the circuit 20 comprises means for over-voltage protection 22 (A) and voltage limiting means 24 (B). In order to further improve the protection of the input stage 25, means 27 (D) for protection against static currents are provided. The means 27 (D) for protection against static currents provide for a positive feedback pulling the input IINV of the input stage 25 up to the supply voltage $V_{DD}$ in order to prevent static (through) currents from flowing through part of the input stage's elements. The means 27 (D) for protection against static currents may comprise a p-type CMOS transistor, for example.

The circuit 20 may further comprise speed boost means 26 (C) having at least one capacitive element (Cb). The speed boost means 26 (C) allow the turn-on/turn-off behavior of the voltage limiting means 24 (B) to be accelerated. The charging of the capacitive element (Cb) depends on the state of a signal derived from the input signal s(t) such that the capacitive element (Cb) is charged to the supply voltage $V_{DD}$ if the input signal s(t) is low. As schematically illustrated in FIG. 5, the speed boost means 26 (C) together with the voltage limiting means 24 (B) may form one functional unit.

The optional means 27 (D) for protection against static currents are employed to limit static through currents. Such a through current typically occurs when the voltage at the node IINV is lower than the supply voltage $V_{DD}$, since the different voltages lead to a voltage difference across the digital input stage.

Figure 6:
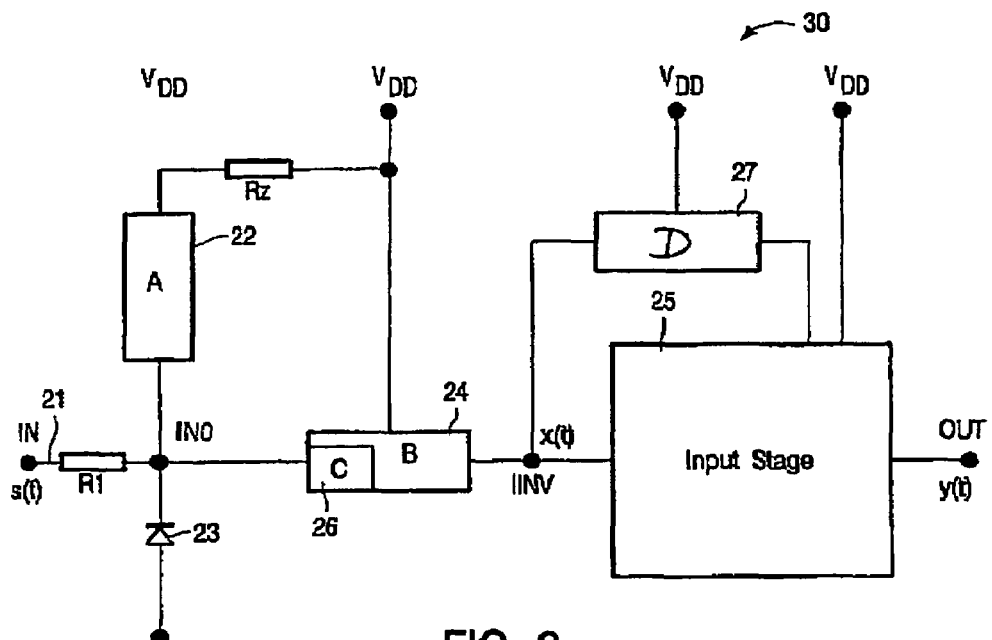
FIG. 6 is a schematic representation of a third embodiment according to the present invention.

Yet another embodiment is depicted in FIG. 6. The circuit 30 is comparable to the one depicted in FIG. 5. Hence identical elements carry the same reference numbers as in FIG. 5. The circuit 30 comprises a current limiting resistor R1 being situated between the signal input 21 (IN) and the input node IN0. A resistor Rz is situated between the means for over-voltage protection 22 (A) and the supply voltage $V_{DD}$.

In another embodiment, the active circuit element being part of the means for over-voltage protection (A) is a transistor. This transistor is arranged such that during normal operation it does not enter conductive state. Preferably, the means for over-voltage protection (A) comprise a plurality of transistors, preferably n-channel CMOS transistors (nz1, nz2, nz3), or p-channel CMOS transistors, or bipolar transistors, and a resistor Rz.

In an advantageous embodiment, the means (D) for protection against static currents provide for a positive feedback pulling the voltage at the input IINV up to the supply voltage $V_{DD}$ in order to prevent the static currents from flowing through part of the elements of the digital input stage. The means (D) for protection against static currents may for example comprise a p-type CMOS transistor (pp2) serving as keeper transistor.

In yet another embodiment, the switch of the voltage limiting means (B) may be an n-channel CMOS transistor (ns). The voltage limiting means (B) may further comprise a p-channel CMOS transistor (pp1) for controlling the voltage at the gate node (GNS) of the n-channel CMOS transistor (ns). According to the present invention, the node GNS is a switched node.

The means for over-voltage protection (A) may be designed so that they absorb destructive voltages when the supply voltage $V_{DD}$ is zero.

Figure 1:
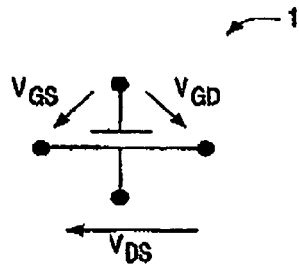
FIG. 1 is a schematic representation of a conventional n-channel transistor.
Figure 2:
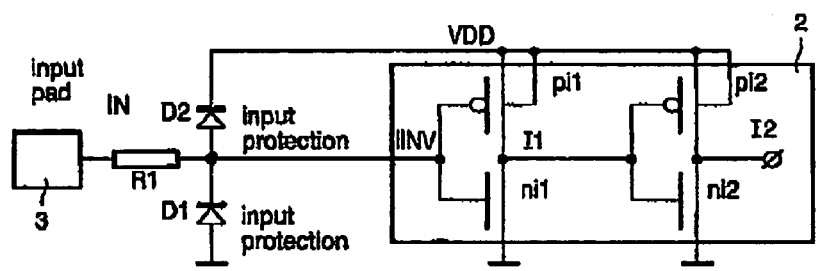
FIG. 2 is a schematic representation of a standard digital input stage.
Figure 3:
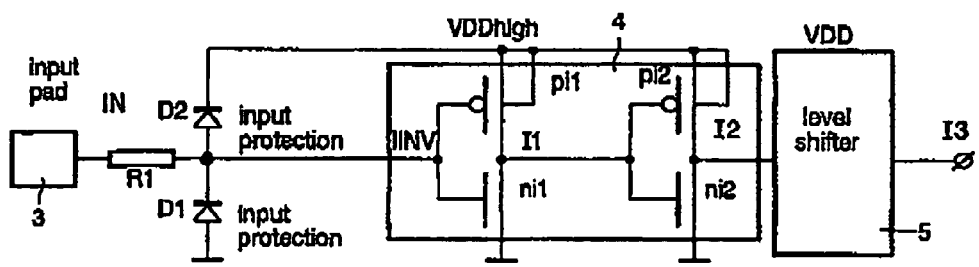
FIG. 3 is a schematic representation of a conventional digital input stage designed to cope with high input voltages.
Figure 7:
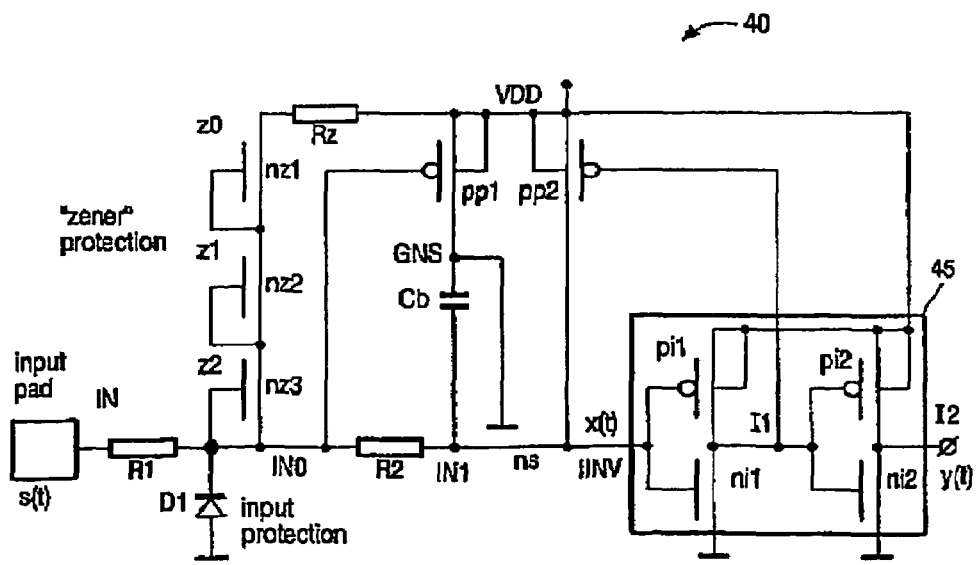
FIG. 7 is a detailed representation of a fourth embodiment according to the present invention.

Another embodiment is illustrated in FIG. 7. As illustrated in this Figure, the circuit 40 comprises a digital input stage 45 with two inverters I1 and I2. The inverter I1 comprises a p-channel transistor pi1 and an n-channel transistor ni1, and the inverter I2 comprises a p-channel transistor pi2 and an n-channel transistor ni2. FIG. 7 further shows a proposal for elements being able to cope with high input swings using only standard elements. As a first step, the usual protection diode D2 to $V_{DD}$ (see FIG. 2 or 3, for example) is removed to avoid static current through this element. It is well proven practice that a single diode D1 with a current limiting resistor R1 sufficiently protects the digital input stage 45 from ESD damage. An input n-channel switch ns is provided, which limits the voltage at node the IINV to $V_{DD}$ and which takes the rest of voltage going beyond $V_{DD}$ thus leading to the circuit 40 being able to cope with an input swing s(t), which is twice $V_{DD}$. For $V_{DD}=V_{max}$ this is $2*V_{max}$. In order to be able to control the gate of the n-channel switch transistor ns at the node GNS, a bootstrap structure comprising a p-channel transistor pp1 and a bootstrap capacitor Cb is used with the following functionality: If the input signal s(t) at node IN is low, the capacitor Cb is charged to $V_{DD}$ at node GNS via the p-channel transistor pp1 and the n-channel switch transistor ns is conducting, thus transferring the input voltage at the node IN to the node IINV. On a rising edge of the input signal s(t), node IN0 goes high turning off the p-channel transistor pp1 and the node IN1 goes high pushing GNS high to keep the n-channel switch transistor ns in conduction. Thus the input state at IN is transferred to the node IINV, but limited in swing by the n-channel switch transistor ns. Any excessive voltage at the node GNS is discharged via the p-channel transistor pp1 to $V_{DD}$ by the p-channel transistor pp1 going into reverse conduction. In this way, the voltage at the node GNS is limited to one p-channel transistor threshold voltage above $V_{DD}$. If the capacitor Cb loses charge over a longer period of time, the node IINV is still kept at the proper voltage by a keeper transistor pp2, which also limits the voltage at the node IINV to $V_{DD}$. In order to allow the p-channel transistor pp1 to be switched off with proper timing, a resistor R2 may be employed that slightly delays the input signal at the node IN1. In case the sequence at the input IN starts with a high voltage after power-up, the sequence starts with the first falling edge on IN. Of course the circuit 40 shall also be operating with a standard input swing between 0 and $V_{DD}$. This requires the first inverter ni1/pi1 of the input stage 45 to be rationed in such a way, that it is able to cope with a high level below $V_{DD}$. By positive feedback via the transistor pp2, the voltage at the node IINV is finally pulled to $V_{DD}$.

In case a high level voltage is applied while the supply voltage $V_{DD}$ is still turned off (a situation which might occur in battery operated systems with elaborate power management), the input is clamped to a safe value via the means for over-voltage protection 22 (A). The means for over-voltage protection 22 (A) may comprise n-channel devices nz1 to nz3 and a resistor Rz, as illustrated in FIG. 7. In normal operation the n-channel devices nz1 to nz3 will not be conducting, but for $V_{DD}=0$ they absorb destructive voltages. The means for over-voltage protection 22 (A) may be comprised of any combination of n-channel, p-channel or bipolar diodes.

Figure 8:
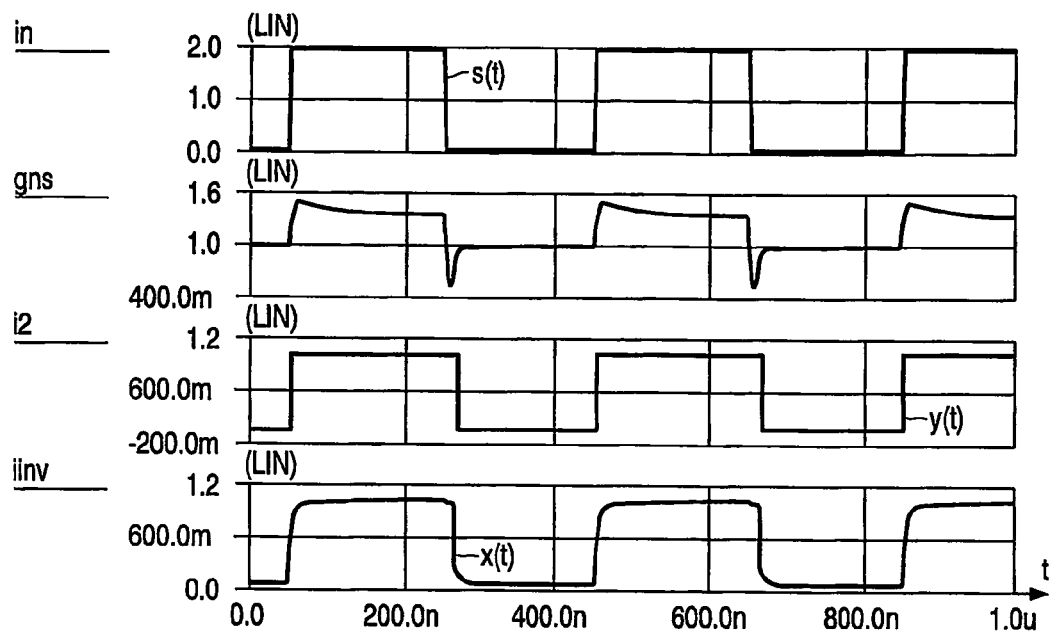
FIG. 8 is a diagram depicting the different voltages at the nodes of a circuit, according to the present invention.
Figure 9:
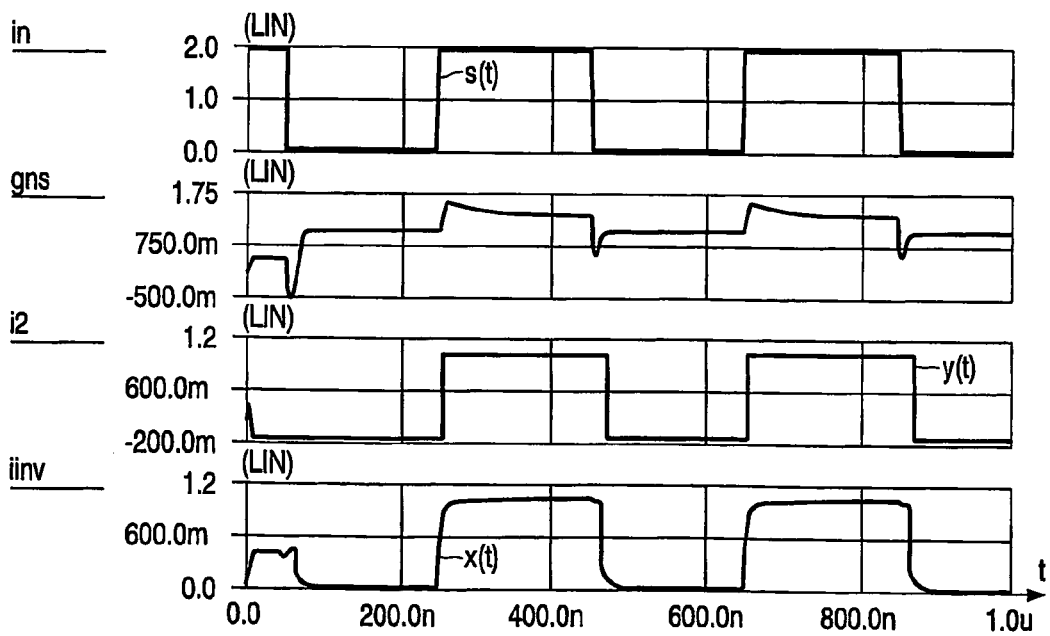
FIG. 9 is another diagram depicting the different voltages at the nodes of a circuit, according to the present invention.

The operation of the circuit 40 depicted in FIG. 7 is explained in connection with the diagrams given in FIGS. 8–11. In all these examples, the supply voltage $V_{DD}=V_{max}$ is set to 1 Volt. In FIGS. 8 and 9 the signal swing of the signal s(t) is 2 Volts.

In FIG. 8 a situation is shown, where the signal sequence s(t) starts at a low level at about 0 Volt at t=0. The signal at the node GNS almost follows the signal s(t). It shows a peak at the falling edge of the signal s(t) that almost goes back to 0 Volt. The circuit blocks A, B, C, and D provide for a voltage x(t) at the node IINV that closely follows the signal s(t) at the input IN. As illustrated in FIG. 8, the maximum voltage of x(t) is at about $V_{DD}=1$ Volt. The edges are somewhat rounded. Finally, the output signal y(t) at the output OUT of the digital input stage 45 are a copy of the signal s(t) with the maximum swing being limited to about $V_{DD}=1$ Volt.

In FIG. 9 a situation is shown, where the signal sequence s(t) starts with a high level at about 2 Volts at t=0. The signal at the node GNS slowly builds up before it more or less follows the signal s(t). The circuit blocks A, B, C, and D provide for a voltage x(t) at the node IINV that after some delay (in the present example the delay is about 250 ns, but only for the first pulse after power-up) closely follows the signal s(t) at the input IN. As illustrated in FIG. 9, the maximum voltage of x(t) is at about $V_{DD}=1$ Volt. The edges are somewhat rounded. Finally, the output signal y(t) at the output OUT of the digital input stage 45 are a copy of the signal s(t) with the maximum swing being limited to about $V_{DD}=1$ Volt. The signal y(t) is also delayed.

Figure 10:
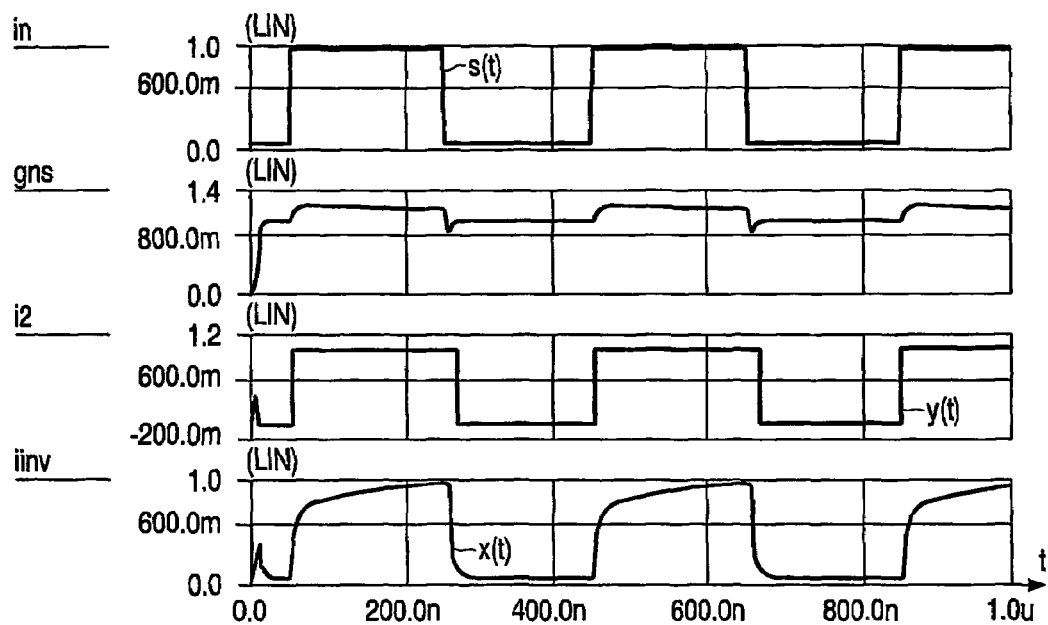
FIG. 10 is another diagram depicting the different voltages at the nodes of a circuit, according to the present invention.
Figure 11:
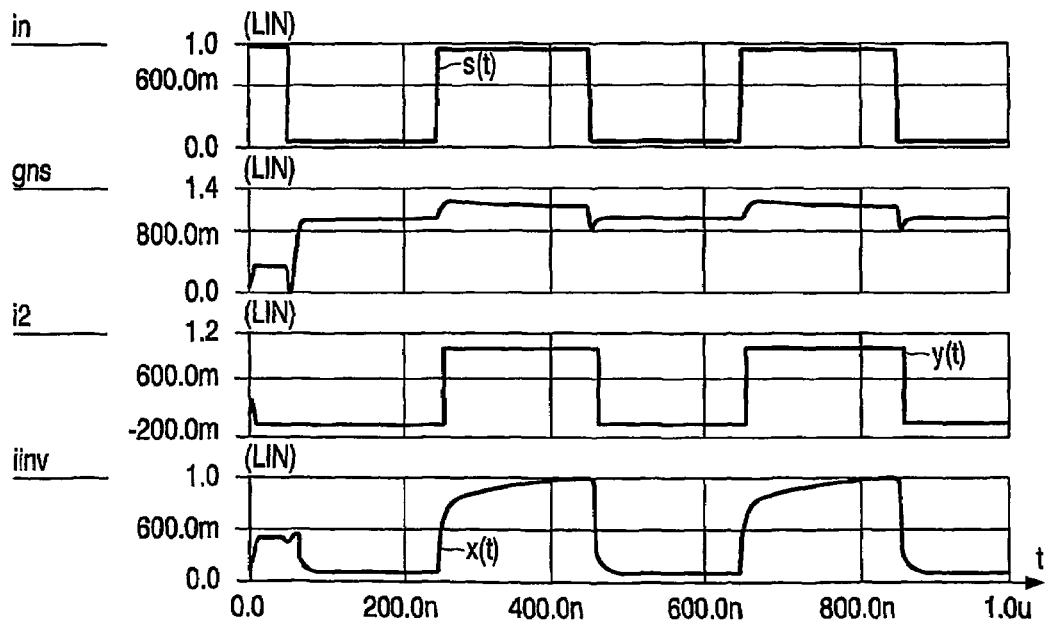
FIG. 11 is another diagram depicting the different voltages at the nodes of a circuit, according to the present invention.

FIGS. 10 and 11 are given to illustrate that the whole circuit 40 is also fully functional when the signal swing of the signal s(t) is low. In the present examples, the signal swing of s(t) remains below 1 Volt. In FIG. 10 a situation is depicted where s(t) starts with a low level at t=0. In FIG. 11 the signal s(t) starts at a high level of about 1 Volt at t=0. In both situations, the output signals y(t) at the output OUT of the digital input stage 45 are copies of the signals s(t) with the maximum swing being limited to about $V_{DD}=1$ Volt. Note that the signal y(t) in FIG. 11 is also delayed.

Various circuits are presented herein, which allow digital input pads to comply with voltages up to 2 times the maximum allowed voltage across one transistor for a given fabrication technology. According to the present invention, standard devices are employed without the need for:

an additional high voltage supply domain,
 a level shifter to bridge the two supply domains,
 additional fabrication process steps, to provide transistors, which withstand high voltages.

Additionally a protection element (A) is presented, which absorbs destructive voltages, when the supply voltage is turned off.

The present scheme can be used to protect CMOS (complementary metal oxide semiconductor) and BiCMOS circuits (bipolar devices combined with CMOS subcircuits on a single chip), for example.

In the drawings and specification there has been set forth preferred embodiments of the invention and, although specific terms are used, the description thus given uses terminology in a generic and descriptive sense only and not for purposes of limitation.

The invention claimed is:

1. A circuit comprising:
 signal input (IN) for receiving an input signal (s(t)),
 a digital input stage (15) being designed for operation at a supply voltage (VDD), the digital input stage (15) comprising:
  CMOS transistors sensitive to voltages across transistor nodes going beyond a voltage limit ($V_{max}$)
  an input (IINV),
 voltage limiting means (B) being arranged between the signal input (IN) and the input (IINV) for limiting voltages at the input (IINV) to the supply voltage (VDD), the voltage limiting means (B) comprising:
  an input switch (ns) being controllable by the state of the input signal (s(t)),
 means for over-voltage protection (A) being situated between the signal input (IN) and the supply voltage (VDD), the means for over-voltage protection (A) comprising at least one active circuit element which functions so as to mimic at least a breakdown part of a zener function, and
 speed boost means (C) having at least one capacitive element (Cb) speeding up the turn-on/turn-off behavior of the input switch (ns).

2. The circuit of claim 1, wherein the element is a transistor being arranged such that during normal operation the transistor does not enter conductive state.

3. The circuit of claim 1 or 2, wherein the transistor of the means for over-voltage protection (A) includes at least one of an n-channel MOS transistor (nz1, nz2, nz3), a p-channel MOS transistor, and a bipolar transistor, and the means for over-voltage protection (A) further comprises a resistor (Rz).

4. The circuit of claim 1 or 2, further comprising a current limiting resistor (R1) being situated between the signal input (IN) and an input node (IN0), and an input protection diode (D1) being situated between the input node (IN0) and ground.

5. The circuit of claim 1 or 2, further comprising means (D) for protection against static currents.

6. The circuit of claim 5, wherein the means (D) for protection against static currents provide for a positive feedback pulling the input (IINV) up to the supply voltage (VDD) in order to prevent the static currents from flowing through part (pi1, ni1) of the input stage (15).

7. The circuit of claim 5, wherein the means (D) for protection against static currents comprise a p-type CMOS transistor (pp2) serving as keeper transistor.

8. The circuit of claim 1, wherein the charging of the capacitive element (Cb) depends on the state of a signal derived, from the input signal (s(t)).

9. The circuit of claim 8, wherein the capacitive element (Cb) is charged to the supply voltage (Vdd) if the input signal (s(t)) is low.

10. The circuit of claim 1 or 2, wherein the input switch is an n-channel MOS transistor (ns).

11. The circuit of claim 1 or 2, wherein the means for over-voltage protection (A) absorb destructive voltages when the supply voltage (VDD) is zero.

12. Circuit according to claim 1 or 2 being made using a submicron fabrication process, preferably a deep submicron fabrication process.

13. A circuit comprising:

signal input (IN) for receiving an input signal (s(t)), a digital input stage (15) being designed for operation at a supply voltage (VDD), the digital input stage (15) comprising:

CMOS transistors sensitive to voltages across transistor nodes going beyond a voltage limit (Vmax), an input (IINV), voltage limiting means (B) being arranged between the signal input (IN) and the input (IINV) for limiting voltages at the input (IINV) to the supply voltage (VDD), the voltage limiting means (B) comprising:

an input switch (ns) being controllable by the state of the input signal (s(t)), means for over-voltage protection (A) being situated between the signal input (IN) and the supply voltage (VDD), the means for over-voltage protection (A) comprising at least one active circuit element which functions so as to mimic at least a breakdown part of a zener function, wherein the input switch is an n-channel MOS transistor (ns), and wherein the voltage limiting means (B) further comprise a p-channel MOS transistor (pp1) for controlling the voltage at the gate node (GNS) of the n-channel MOS transistor (ns).

* * * * *